(12) United States Patent
Izumi et al.

(10) Patent No.: US 7,776,666 B2
(45) Date of Patent: Aug. 17, 2010

(54) THIN FILM TRANSISTOR AND METHOD OF MANUFACTURING THIN FILM TRANSISTOR

(75) Inventors: Tomoo Izumi, Toyonaka (JP); Jun Yamada, Ibaraki (JP)

(73) Assignee: Konica Minolta Holdings, Inc., Tokyo (JP)

( * ) Notice: Subject to any disclaimer, the term of this patent is extended or adjusted under 35 U.S.C. 154(b) by 634 days.

(21) Appl. No.: 11/703,609

(22) Filed: Feb. 7, 2007

(65) Prior Publication Data

US 2007/0190707 A1 Aug. 16, 2007

(30) Foreign Application Priority Data

Feb. 10, 2006 (JP) .............................. 2006-033614
Jul. 3, 2006 (JP) .............................. 2006-183096

(51) Int. Cl.
*H01L 21/84* (2006.01)
(52) U.S. Cl. ................. 438/158; 257/E21.414
(58) Field of Classification Search .......... 438/142–308
See application file for complete search history.

(56) References Cited

U.S. PATENT DOCUMENTS

2004/0129978 A1* 7/2004 Hirai ..................... 257/347
2005/0051780 A1* 3/2005 Ando et al. ................. 257/72
2007/0012950 A1* 1/2007 Cain et al. ................. 257/194
2007/0018151 A1* 1/2007 Sirringhaus et al. ........... 257/40

FOREIGN PATENT DOCUMENTS

JP          10-190001         7/1998
JP          2005-175157     *  6/2005
WO          WO 01/47043 A1    6/2001

OTHER PUBLICATIONS

Dimitrakopoulos, Christos D., and Malenfant, Patrick R.L., "Organic Thin Film Transistors for Large Area Electronics," Advanced Materials, 2002, 14, No. 2, Jan. 16, pp. 99-117.
Chung, Wonsuk, Thompson, Michael O., Wickboldt, Paul, Toet, Daniel, and Carey, Paul G., "6.4: Crystallization of Ultra-low Temperature ITO by XeCI Excimer Laser Annealing," SID 02 Digest, 2002, pp. 57-59.

* cited by examiner

*Primary Examiner*—Chandra Chaudhari
(74) *Attorney, Agent, or Firm*—Brinks Hofer Gilson & Lione

(57) ABSTRACT

A method of manufacturing a low-cost thin film transistor of minimized variations in performances, as well as the thin film transistor produced thereby. A thin film transistor manufacturing method including the steps of: forming a gate electrode on a substrate; forming a gate insulation layer on the gate electrode; forming a semiconductor layer by coating the gate insulation layer with a semiconductor material; forming a repellent layer having an electrode material-repellent characteristic on the semiconductor layer; applying light from the surface of the substrate where there is no gate electrode, thereby removing the semiconductor layer and the repellent layer by sublimation, except for the portion protected against light by the gate electrode; and dropping the fluid electrode material on the repellent layer remaining on the substrate so that the fluid electrode material is separated by the repellent layer, whereby the source electrode and the drain electrode are formed.

12 Claims, 7 Drawing Sheets

THIN FILM TRANSISTOR AND METHOD OF MANUFACTURING THIN FILM TRANSISTOR

This application is based on Japanese Patent Application No. 2006-033614 filed on Feb. 10, 2006, and No. 2006-183096 filed on Jul. 3, 2006, in Japanese Patent Office, the entire content of which is hereby incorporated by reference.

TECHNICAL FIELD

The present invention relates to a method of manufacturing a thin film transistor, and the thin film transistor manufactured thereby.

BACKGROUND

With widespread use of an information terminal, there has been a growing need for a flat panel display as a computer display. As the information-oriented society advances, the information having been provided in the form of paper media so far is more often provided as digital information. Thus, there has been an increasing need for electronic paper or digital paper as a thin, light and easily portable mobile display medium.

In a flat panel display apparatus, the display medium is commonly made up of devices based on liquid crystal, organic electroluminescence and electrophoresis. To ensure uniform screen brightness and screen rewriting speed, such a display medium mainly uses the technology wherein an active drive device made up of a thin film transistor (TFT) is used as an image drive device.

To produce a TFT device, a semiconductor thin film such as an a-Si (amorphous silicon) and p-Si (polysilicon), and a metal thin film such as a source, a drain and a gate electrode are sequentially formed on a glass substrate in general cases. Manufacturing of a flat panel display based on the TFT usually requires a high-precision photolithography step, in addition to the thin film forming step that needs such vacuum-based equipment as a CVD and sputtering device and high-temperature processing steps. This requires high running costs and high equipment costs. Further, to meet the requirements for larger display screens in recent years, the costs have been expanded immensely.

In recent years, there is a very active effort going on in the research and development projects for an organic TFT device using the organic semiconductor material as a technology to make up for the demerits of the conventional TFT device (Japanese Laid-Open Patent Publication No. H10-190001 and Journal of Advanced Material Vol. 2, 2002, P. 99 (Review)). This organic TFT device can be produced in a low-temperature process, and permits use of a crack-resistant resin substrate of light weight. Further, this device is claimed as providing a flexible display using a resin film as a support member (SID '02 Digest P. 57). Further, a very low-cost display with excellent productivity may be achieved by using the organic semiconductor material that can be manufactured in a wet process of printing and coating under atmospheric pressure.

A technique has been disclosed to manufacture an organic TFT using an inkjet for electrode formation (e.g., Brochure for International Publication No. 01/47043). This technique allows use of a process that does not employ a vacuum system. However, a polyimide film formed according to the photolithography method is still used in the channel area between the source and drain electrode.

The technique disclosed in the Brochure for International Publication No. 01/47043 is based on photolithography, and requires a complicated process and higher production costs. Further, accuracy in channel formation depends on the accuracy in photolithography and inkjet exposure positioning. This raises a problem of increasing variations in performances among devices. Further, at the time of forming the source electrode and the drain electrode, a liquid material is emitted. This tends to cause short circuiting. When short circuiting has occurred, a non-defective device cannot be produced.

To improve the channel formation accuracy, a method has been proposed for forming a channel wherein the unwanted portion of the semiconductor layer is sublimed and removed by application of ultraviolet rays (e.g., Japanese Laid-Open Patent Publication No. 2005-175157).

The method disclosed in the Japanese Laid-Open Patent Publication No. 2005-175157, however, requires mask alignment for semiconductor formation. This method improves the accuracy of the channel configuration, but is insufficient relative positioning.

A method has been proposed for high-accuracy layout of self-assembled monolayers on the gate electrode projection area of the surface of the insulation film on an selective basis, wherein the orientation order of the organic semiconductor film is improved on only inside the gate electrode projection area on an selective basis, not improved on the light-exposed area outside the gate electrode projection area (e.g., Japanese Laid-Open Patent Publication No. 2005-79560).

The method disclosed in the Japanese Laid-Open Patent Publication No. 2005-79560, however, permits channel formation without using the method of photolithography. It provides only the patterning of the orientation control capability of the self assembled monolayer, and the active portion of the semiconductor cannot be strictly patterned.

As described above, the method disclosed in the Japanese Laid-Open Patent Publication No. 2005-79560 provides only the patterning of the orientation control capability of the self assembled monolayer, without patterning of the semiconductor layer per se. This arrangement tends to produce greater variations in performances among thin film transistors.

SUMMARY

An object of the present invention is to solve the aforementioned problems and to provide a method of manufacturing a low-cost thin film transistor, and a thin film transistor, wherein the variations in the size and relative position of semiconductors are reduced to minimize the variations in performances are reduced.

In view of forgoing, one embodiment according to one aspect of the present invention is a method of manufacturing a thin film transistor which includes at least a gate electrode, a semiconductor layer, a source electrode and a drain electrode on a transmissive substrate, the method comprising the steps of:

forming the gate electrode on the substrate;

forming a gate insulation layer on the gate electrode;

forming the semiconductor layer on the gate insulation layer;

forming a repellent layer on the semiconductor layer, the repellent layer being repellent to a fluid electrode material;

a removing step for removing a part of the semiconductor layer and the repellent layer other than an area shaded from the light with the gate electrode, by irradiating light from an opposite surface to a surface on which the gate electrode is formed; and forming the source electrode and the drain electrode by dropping the fluid electrode material on the repellent layer and dividing the fluid electrode material by the repellent.

According to another aspect of the present invention, another embodiment is a method of manufacturing a thin film transistor which includes at least a gate electrode, a semiconductor layer, a source electrode and a drain electrode on a transmissive substrate, the method comprising the steps of:

forming the gate electrode on the substrate;
forming a gate insulation layer on the gate electrode;
forming the semiconductor layer on the gate insulation layer;
forming a repellent layer on the semiconductor layer, the repellent layer being repellent to a fluid electrode material;
removing the repellent layer and the semiconductor layer by irradiating light to form a repellent layer whose shape is the same as the gate electrode and to form a semiconductor layer whose shape is grater than the shape of the formed repellent layer; and
forming the source electrode and the drain electrode.

According to another aspect of the present invention, another embodiment is a method of manufacturing a thin film transistor which includes at least a gate electrode, a semiconductor layer, a source electrode and a drain electrode on a transmissive substrate, the method comprising the steps of:

forming the gate electrode on the substrate;
forming a gate insulation layer on the gate electrode;
forming the semiconductor layer on the gate insulation layer;
forming a repellent layer on the semiconductor layer, the repellent layer being repellent to a fluid electrode material;
removing a part of the repellent layer not shaded with the gate electrode and a part of the semiconductor layer not shaded with a photo mask pattern by irradiating light, which has an enough amount of light to remove the semiconductor layer, through the photo mask to cover the gate electrode, the photomask having the mask pattern which transmits light whose amount of light is enough to remove the repellent layer and not enough to remove the semiconductor layer when light strong enough to remove the semiconductor layer is irradiated to the photo mask; and
forming the source electrode and the drain electrode.

According to another aspect of the present invention, another embodiment is a method of manufacturing a thin film transistor which includes at least a gate electrode, a semiconductor layer, a source electrode and a drain electrode on a transmissive substrate, the method comprising the steps of:

forming the gate electrode on the substrate;
forming a gate insulation layer on the gate electrode;
forming the semiconductor layer on the gate insulation layer;
forming a repellent layer on the semiconductor layer, the repellent layer being repellent to a fluid electrode material;
irradiating light, which has an amount of light enough to remove the repellent layer and not enough to remove the semiconductor layer, from an opposite surface to a surface where the gate electrode is formed, and removing a part of the repellent layer not shaded with the gate electrode;

irradiating light on the semiconductor layer through a photo mask and removing the semiconductor layer, the photo mask having a mask pattern to shade an area wider than the gate electrode and being disposed on a same side of the substrate as the semiconductor layer is formed; and forming the source electrode and the drain electrode.

According to another aspect of the present invention, another embodiment is a thin film transistor, comprising, a substrate;
an gate electrode disposed on the substrate;
a gate insulation layer disposed on the gate electrode;
an alignment layer which is comprised of a self assembled monolayer and disposed on the insulation layer;
a semiconductor layer disposed on the alignment layer;
a repellent layer which is disposed on the semiconductor layer, and is comprised of a self assembled monolayer which is repellant to an electrode material for forming a source electrode and a drain electrode;
a source electrode which is connected to the semiconductor layer; and
a drain electrode which is connected to the semiconductor layer.

DETAILED DESCRIPTION OF THE PREFERRED EMBODIMENT

Referring to embodiments, the following describes the present invention without the present invention being restricted thereto.

Figure 1:
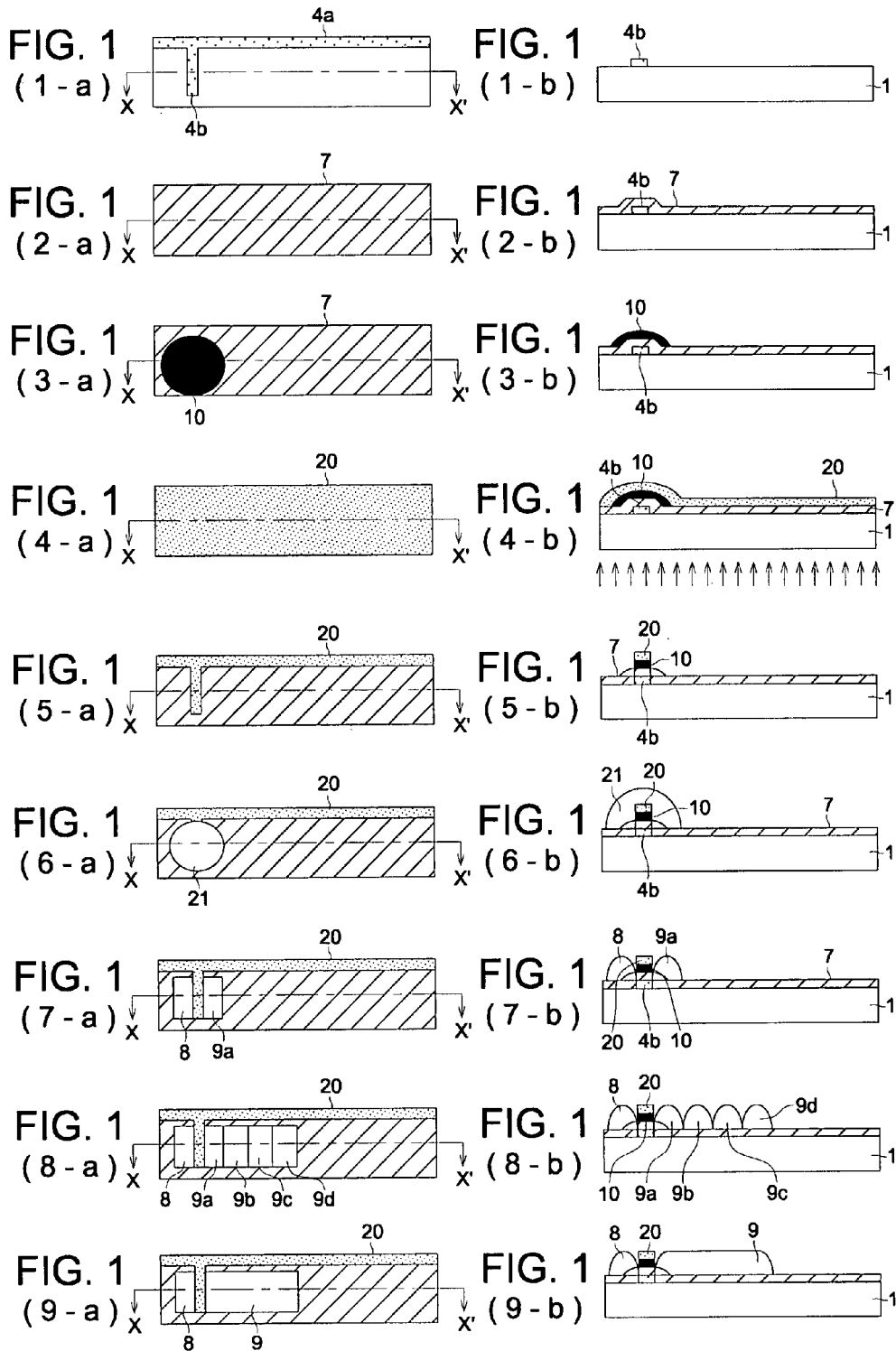
FIGS. 1(1-a) to 1(9-b) are explanatory diagrams showing a method of manufacturing a thin film transistor of the present invention.

FIGS. 1(1-a) to 1(9-b) are explanatory diagrams showing an example of the method of manufacturing a thin film transistor (hereinafter referred to as "TFT") of the present invention. Referring to FIGS. 1(1-a) to 1(9-b), the following provides a step-by-step explanation of the manufacturing method for forming a bottom gate type TFT wherein a gate electrode 4b is provided on the substrate 1, a gate insulation layer 7 and a semiconductor layer 10 are then formed, and a source electrode 8 and the drain electrode 9 are provided.

FIGS. 1(1-a) through 1(9-a) are plans showing the substrate 1 as viewed from the top. FIGS. 1(1-b) through FIG. 1(9-b) are respectively cross sectional views showing the substrate 1 taken along arrow line X-X' in FIGS. 1(1-a) through FIG. 1(9-a).

An example of manufacturing the organic TFT of the present invention will be explained with reference to the following Steps S1 through S7. S1 is a step of forming a gate electrode 4b on the transmissive substrate 1. S2 is a step of forming a gate insulation layer 7. S3 is a step of forming a semiconductor layer 10. S4 is a step of forming a repellent layer 20. S5 is a step of removing the semiconductor layer 10 and the repellent layer 20. S6 is a step of forming a source electrode 8 and a drain electrode 9.

The following describes each step:

S1: A step of forming a gate electrode 4 on the transmissive substrate 1. A photosensitive resist is applied to the substrate 1 on which a conductive thin film formed. After that, exposure and development are performed through the photomask of each electrode pattern, whereby the resist layer of each electrode pattern is formed. It should be noted that the procedures up to this point are not shown in FIGS. 1(1-*a*) to 1(9-*b*).

In the embodiment of the present invention, there is no restriction to the material of the substrate 1. For example, glass or a flexible resin sheet can be used. The conductive thin film can be formed as a conductive thin film on the substrate 1 by vapor deposition, sputtering or CVD method, using a low-resistant metal material such as Al, Cr, Ta, Mo and Ag, or a lamination of these metals. Further, the material can be doped with other materials for improving the heat resistance of the metal thin film and close contact on the supporting substrate and for avoiding defects. Further, a transparent electrode such as ITO, IZO, SnO and ZnO can also be used.

Then, after the substrate 1 has been etched, the resist layer on the gate electrode 4 is removed, and a gate electrode 4*b* and a gate bus 4*a* are formed, as shown in FIG. 1(1-*a*) and FIG. 1(1-*b*).

S2: A step of forming a gate insulation layer 7.

As shown in FIG. 1(2-*a*) and FIG. 1(2-*b*), a gate insulation layer 7 is formed.

The gate insulation layer 7 can be formed in a dry process such as vapor deposition, sputtering, CVD method or atmospheric plasma method. There is no restriction to the material of the gate insulation layer 7. Various types of insulation film can be employed. For example, an inorganic oxide coating of high relative dielectric constant such as silicon oxide, aluminum oxide, tantalum oxide and titanium oxide are used. It is also possible to use as a coating material the PVP, polyimide or polysiloxane-based organic material and inorganic film material that can be coated.

S3: A step of forming a semiconductor layer 10.

A semiconductor layer 10 is formed as shown in FIG. 1(3-*a*) and FIG. 1(3-*b*).

There is no particular restriction to the semiconductor material if it can be dissolved or dispersed in solvent. It goes without saying that the organic high-molecular material can be used. In recent years, the pentacene as a low molecular material is dissolved in a heated solvent and is coated. The semiconductor material can be either a low molecular material or a high-molecular material.

Further, either the organic inorganic hybrid material or inorganic material can be used in the embodiment of the present invention.

The applicable materials are typically exemplified by polythiophenes such as poly(3-hexylthiophene); aromatic oligomers such as oligothiophene having a hexamer of thiophene on the lateral chain; pentacenes with a substituent added to the pentacene for improved solubility; copolymer (F8T2) of fluorene and bithiophene; and polythienylene vinylene or phthalocyanine. Thus, any soluble semiconductor can be used. Particularly, pentacenes are exemplified by silylethynyl pentacene containing 6,13-bistriisopropylsilylethynyl pentacene, and 6,13-bistriethylsilylethynyl pentacene. They are semiconductor materials disclosed in the patent document, U.S. Pat. No. 6,690,029 as a Patent Document and in the non-patent document, the Journal of J. AM. Chem., 2005, Vol. 127, pp. 4986-4987. Two substituents are added to pentacene to control the molecular interaction, whereby a high degree of mobility is provided.

Further, the material such as pentacene that is formed by the vapor deposition method can be used as a semiconductor material. An approximate pattern can be formed by mask vapor deposition.

For example, in a pretreatment for forming a semiconductor layer 10, the material is subjected to the so-called OTS treatment wherein it is immersed in the solution prepared by dissolving 0.1 mol/l of octadesyl trichlorosilane in toluene. Then a semiconductor layer 10 is formed by the spin coating method, for example, using the solution prepared by dissolving poly(3-hexylthiophene) in dichlorobenzene at a concentration of 0.3% by mass. Not only the spin coating method, but also the inkjet method or micro contact printing method can be used to form a semiconductor layer 10. Any film making method can be used.

S4: A step of forming a repellent layer 20.

A repellent layer 20 is formed as shown in FIG. 1(4-*a*) and FIG. 1(4-*b*).

The following describes the repellent layer 20 as an embodiment of the present invention.

The repellent layer 20 is a layer that repels the material used to produce an electrode (specifically, a source electrode and a drain electrode), and is formed on the organic semiconductor layer in this example.

In this example, in the repellent layer formation process, the surface of the substrate 1 is covered with the self-assembled monolayer (SAM) after formation of the semiconductor layer 10. For example, the substrate 1 is immersed in the solution prepared by dissolving 0.1 mol/l of octadesyl trichlorosilane in toluene.

In the repellent layer forming process, patterning may be applied only to the semiconductor layer 10. In this case, any material can be used if patterning can be achieved. For the purpose of minimizing the impact on the semiconductor layer 10, however, a wet process in printing or the like is preferably used. For example, a silicon adhesive is printed by screen printing method, and is heated up to 50° C. so that it will be cured.

Of various wet processes, the inkjet method is used with particular preference.

In the inkjet method, the inkjet based on the commonly known piezo method can be used. Particularly, the inkjet based on electrostatic suction method is preferably used because it permits exposure of a very fine pattern.

When the repellent layer is formed by the inkjet method, it is preferred to provide an ink receiving layer in order to ensure proper adjustment of the size of the area formed by ink emission. The liquid particles are sucked and retained by the ink receiving layer. After that, they are dried or cured. Thus, the spread of the liquid particles can be minimized.

A porous type receiving layer used for the commonly known inkjet recording medium is preferably used as an ink receiving layer.

Any layer can be used as a repellent layer as long as it repels the electrode material. In this case, it is possible to use the materials for forming an ink repellent layer of the so-called waterless printing plate, as disclosed in the Japanese Laid-Open Patent Publication No. H09-292703, Japanese Laid-Open Patent Publication No. H09-319075, Japanese Laid-Open Patent Publication No. H10-244773, Examined Japanese Patent Publication No. S54-26923, Examined Japanese Patent Publication No. S56-23150, Examined Japanese Patent Publication No. S61-614, Japanese Laid-Open Patent Publication No. H08-82921, Japanese Laid-Open Patent Publication No. H10-319579, Japanese Laid-Open Patent Publication No. 2000-275824, Japanese Laid-Open Patent Publication No. 2000-330268, Japanese Laid-Open Patent Publication No. 2001-201849, Japanese Laid-Open Patent Publication No. 2001-249445, Japanese Laid-Open Patent Publication No. 2001-324800, Japanese Laid-Open Patent Publication No. 2002-229189, Japanese Laid-Open Patent Publication No. H04-324865, Japanese Laid-Open Patent Publication No. H05-53318, Japanese Laid-Open Patent Publication No. H05-257269, Japanese Laid-Open Patent Publication No. H06-89023, Japanese Laid-Open Patent Publication No. H07-199454, Japanese Laid-Open Patent Publication No. H08-328240, Japanese Laid-Open Patent Publication No. H09-62001, Japanese Laid-Open Patent Publication No. H09-120157, Japanese Laid-Open Patent Publication No. H11-30852, Japanese Laid-Open Patent Publication No. 2001-188339, Japanese Laid-Open Patent Publication No. 2001-343741, Japanese Laid-Open Patent Publication No. 2002-131894, and Japanese Laid-Open Patent Publication No. 2002-268216. Use of the silicone rubber layer is more preferred. It is also possible to employ a silane coupling agent, titanate coupling agent, and silicone polymer-based adhesive. Further, lipophilic materials such as a phenol resin and an epoxy resin can be utilized when employing the electrode material using a solvent mainly made up of water.

It is also possible to use the ultra-water repellent material as described in the SCIENCE, Vol. 299, P. 1377.

S5: A step of removing the semiconductor layer and the repellent layer.

As shown in FIG. 1(4-b), a light flux is applied from the arrow-marked direction on the back of the substrate 1, whereby the semiconductor layer 10 and the repellent layer 20 are removed. The result of this procedure is given in FIG. 1(5-a) and FIG. 1(5-b).

For example, a laser is used as a light source, and light fluxes are sequentially applied from the back surface of the substrate 1 to carry out exposure. Light fluxes except for those on the gate electrode 4 reach the semiconductor layer 10 and the repellent layer 20 laminated on the substrate 1 so that the semiconductor layer 10 are repellent layer 20 are sublimed, whereby these layers are removed. For the gate electrode 4, in the meantime, the gate electrode 4 serves as a mask to shield the light. The gate insulation layer 7, the semiconductor layer 10 and the repellent layer 20 on the gate electrode 4 remain as they are. In addition, the gate insulation layer 7 allows transmission of the light.

The same result will be obtained when ultraviolet rays are used as a light source to perform collective exposure.

S6: A step of forming a source electrode and a drain electrode.

As shown in FIGS. 1(6-a) and 1(6-b), when the fluid electrode material 21 shown below is supplied to the aforementioned repellent layer 20, the fluid electrode material 21 is subjected to interaction from the surface of the repellent layer 20, as shown in FIGS. 1(7-a) and 1(7-b), and is separated into the source electrode 8 and the drain electrode 9a. Then, as shown in FIGS. 1(8-a) and 1(8-b), in order to expand the range of a drain electrode 9, the fluid electrode material 21 is supplied to form a drain electrode 9b, a drain electrode 9c and a drain electrode 9d. The drain electrodes 9a through 9d are expanded to form the drain electrode 9 having a wide range as shown in FIGS. 1(9-a) and 1(9-b).

<<Fluid Electrode Material: Constituent Material of Source Electrode 8, Drain Electrode 9 and Others>>

The fluid electrode material 21 as an embodiment of the present invention is PEDOT/PSS (poly(ethylenedioxythiophene)/poly(styrenesulfonic acid)). Various means for the production of the organic semiconductor layer (to be described later) can be used to form the source electrode 8 and the drain electrode 9 by supplying the fluid electrode material 21 onto the aforementioned repellent layer 20. Of these methods, the inkjet method is used with particular preference.

When the ink containing the fluid electrode material 21 is emitted onto the repellent layer to form a source electrode and a drain electrode by the inkjet method, an ink receiving layer is preferably provided for the purpose of forming the electrode area formed by ink emission to be an adequate size. A porous type receiving layer used for the commonly known inkjet recording medium is preferably used as an ink receiving layer.

After the Step S6, an insulating thin film and contact holes are formed, and a pixel electrode is formed by the coating type ITO, whereby a complete organic TFT is produced.

The embodiment of the present invention provides a method of manufacturing a low-cost thin film transistor of minimized variations in performances, as well as the thin film transistor produced thereby.

EXAMPLE

The following describes the Examples for confirming the advantages of the embodiment of the present invention, without the present invention being restricted thereto.

Example 1-1

In the Example, a 150×170 mm glass substrate with an AlNd film formed on the surface at a thickness of 125 nm was used as a substrate 1. In this Example, 100 organic TFTs (10×10) were formed on the substrate 1.

[Preparation of Organic TFT]

The TFTs were prepared in the Steps S1 through S6 described with reference to FIGS. 1(1-a) through 1(9-b). The numbers of the Steps will be assigned, and the same description will be omitted to avoid duplication.

S1: A step of forming a gate electrode 4b on the transmissive substrate 1.

A resist is formed on the substrate 1 at a thickness of about 1 μm. Then the gate electrode 4b and gate bus 4a were provided through the steps of exposure, development, AlNd etching and resist removing.

S2: A step of forming a gate insulation layer 7.

A $SiO_2$ film is formed on the substrate 1 at a thickness of 500 nm as the gate insulation layer 7 by the plasma CVD method, using the TEOS (tetraethoxysilane) gas.

S3: A step of forming a semiconductor layer 10.

After cleaning, poly(3-hexylthiophene) was dissolved in chloroform at a concentration of 0.3% by mass. The solvent obtained therefrom was used as a semiconductor material, and an adequate amount of this solution was dropped onto the portion corresponding to the gate electrode 7b on the gate insulation layer 7 according to the inkjet method.

S4: A step of forming a repellent layer 20.

In the next step of forming a repellent layer 20, 10 nm of an aqueous solution of PVA was applied onto the aforementioned semiconductor by the spin coating method. The substrate 1 processed in the Step S3 was immersed in the solution in which 0.1 mol/l of octadesyl trichlorosilane as a self-assembled monolayer was dissolved in toluene.

S5: A step of removing the semiconductor layer and the repellent layer.

Using an excimer laser processing apparatus, a laser beam was applied from the rear surface of the substrate. Collective exposure, masked by the gate electrode 4b, of gate the insulation layer 7, the semiconductor layer 10 and the repellent layer 20 was conducted. The details are given as follows:

Wavelength of laser beam: 532 nm; output energy: 2 mJ; pulse width: 6 nm; one-shot area: 150 μm×150 μm S6: A step of forming a source electrode and a drain electrode.

An adequate amount of PEDOT/PSS (poly(ethylenedioxythiophene)/poly(styrenesulfonic acid)) was dropped on the repellent layer 20 by the inkjet method. Further, an adequate amount of PEDOT/PSS was dropped to the position where the area of the drain electrode 9 is extended.

Lastly, a polyimide-based insulating thin film was formed by flexographic printing. Contact holes were formed by laser, and a pixel electrode was formed by a coating type ITO, whereby a complete organic TFT array substrate was produced.

Example 1-2

The following describes the Example 1-2 for the purpose of demonstrating the advantages of the embodiment of the present invention:

In this Example, the substrate 1 was the same as that in the Example 1-1, and the Steps S1 through S4 were the same as those in the Example 1-1. In the Step S5, ultraviolet rays were applied to the entire rear surface of the substrate 1 using an UV exposure apparatus. Collective exposure, masked by the gate electrode 4b, of the semiconductor layer 10 and the repellent layer 20 was carried out. The details are given below:

Wavelength of laser beam: 405 nm; output energy: 500 W; exposure time: 50000 sec.

The conditions in the Steps S6 and thereafter used for production were the same as those in the Example 1-1.

Example 1-3

The following describes the Example 1-3 for the purpose of demonstrating the advantages of the embodiment of the present invention:

In this Example, the substrate 1 was the same as that in the Example 1-1, and the Steps S1 through S3 were the same as those in the Example 1-1. In the Step S4, a silicon adhesive was printed by the screen printing method. After being heated at 50° C., it was cured. In the process of removing the semiconductor layer 10 and the repellent layer 20 in the Step S5, the laser beam having the same wavelength, output energy, pulse width as those in the Example 1-1 was applied. In this case, however, the number of shots was increased by three times.

The conditions in the Steps S6 and thereafter used for production were the same as those in the Example 1-1.

[Experimental Result]

Table 1 shows the experimental result. Of 100 organic TFT devices on the glass substrate produced under different conditions, 24 organic TFT devices were selected at random in this experiment, and the ON/OFF current ratio (the current value between the source and drain when the TFT is ON/the current value between the source and drain when the TFT is OFF) was evaluated for each of them.

TABLE 1

| | | Example 1-1 | Example 1-2 | Example 1-3 | Comp. 1 |
|---|---|---|---|---|---|
| Mobility ($cm^2/V \cdot S$) | Average value | 0.013 | 0.01 | 0.011 | 0.011 |
| | Standard deviation | 0.000663 | 0.00159 | 0.000418 | 0.010747 |
| | Standard deviation/ average value | 0.051 | 0.159 | 0.038 | 0.977 |
| ON/OFF current ratio | Average value | 3.20E+04 | 2.00E+04 | 1.90E+04 | 1.40E+04 |
| | Standard deviation | 14700 | 9238 | 9186 | 10733 |
| | Standard deviation/ average value | 0.46 | 0.46 | 0.48 | 0.77 |

Comp.: Comparative example

The Comparative Example 1 is an experiment example given for the sake of comparison. In the Comparative Example 1, organic TFTs are manufactured as follows. As disclosed in the Japanese Laid-Open Patent Publication No. 2005-79560, light is applied from the rear surface of the gate electrode, and the area to be an active portion of the semiconductor formed later was patterned. Then the fluid electrode material is emitted on the repellent layer formed on the gate electrode, and the source electrode and the drain electrode were formed. After that, a semiconductor layer is formed.

The organic TFT device in the Comparative Example 1 was prepared as follows: 100 organic TFTs (10×10) were formed using a 150 mm×170 mm glass substrate with the same AlNd film as that in the Example 1-1 formed on the surface at a thickness of 125 nm. A resist is formed on the substrate 1 at a thickness of about 1 μm. Then the gate electrode and gate bus were provided through the steps of exposure, development, AlNd etching and resist removing.

Then a gate insulation film was formed by the same method as that in the Example 1-1.

In the next repellent layer forming process, the material is subjected to the OTS treatment wherein it is immersed in the solution prepared by dissolving 0.1 mol/l of the octadesyl trichlorosilane in toluene.

Using a commercially available excimer laser processing apparatus, a laser beam was applied from the rear surface of the substrate, whereby the repellent layer was patterned to be the same shape as the gate. The details are given below:

Wavelength of laser beam: 532 nm; output energy: 2 mJ; pulse width: 6 nm; one-shot area: 150 μm×150 μm An adequate amount of PEDOT/PSS (poly(ethylenedioxythiophene)/poly(styrenesulfonic acid)) was dropped onto the repellent layer 20 according to the inkjet method. A source electrode and a drain electrode were formed on the portion that did not exhibit water repellency due to exposure to light in the self-assembling manner.

The following describes the step of forming a semiconductor layer:

In the Comparative Example 1, in the semiconductor layer formation process, the solvent obtained by dissolving 0.3% by mass of poly(3-hexylthiophene) into chloroform was used as a semiconductor material. This solvent was dropped between the source electrode and the drain electrode by the inkjet method. The semiconductor material having been dropped spreads to cover the source electrode and the drain electrode as well.

In the Example 1-1, Example 1-2 and Example 1-3, a repellent layer 20 was formed on the semiconductor layer 10. A laser beam was used to remove the unwanted portions of the semiconductor layer 10 and the repellent layer 20. Then PEDOT/PSS was dropped to form a source electrode 8 and a drain electrode 9. In the Comparative Example 1, after formation of a repellent layer on the gate insulation film, light was used for patterning to the repellent layer to be the same shape as the gate. Then PEDOT/PSS was dropped thereon, whereby a source electrode 8 and a drain electrode 9 were formed. After that, the semiconductor layer 10 was formed.

The expeimental result demonstrates that the organic TFTs created in the Example 1-1, Example 1-2 and Example 1-3 have smaller variations in mobility and ON/OFF current ratio than those of the Comparative Example 1. It has also been revealed that the mobility and ON/OFF current ratio provide the performances equal to or better than those in the Comparative Example 1.

It has been revealed that in the Example 1-1 wherein the repellent layer 20 was coated with the octadesyl trichlorosilane of self-assembled monolayer, both the mobility and ON/OFF current ratio are more improved, and variations are smaller than those in the Example 1-3 wherein the silicon adhesive is printed.

As described above, in the Example of the present invention, the semiconductor layer 10 is sublimed by exposure to light and patterning is performed in the Step S5. This arrangement provides higher dimensional accuracy of the channel portion, and produces a semiconductor device characterized by reduced variations in mobility. On the other hand, the method used in the Comparative Examples 1 fails to ensure formation of the channel of the last mounted semiconductor in high dimensional precision. This is estimated to produce greater variations.

Example 2

The following describes the Example 2 for the purpose of verifying the advantages of the embodiment of the present invention:

In this Example, the substrate 1 was the same as that of the Example 1-1, and the conditions for the Steps S1 through S4 were the same as those in the Example 1-1. In the Step S5, using the same commercially available excimer laser processing apparatus as that in the Example 1-1, a laser beam was applied from the rear surface of the substrate. In the Example 2, light is applied in two processes; a first irradiation process wherein light is applied from the gate electrode 4b to the drain electrode 9, and a second irradiation process wherein light is applied from the gate electrode 4b to the source electrode 8. Further, the angle of the laser beam applied in the first process is different from that in the second irradiation process. This will be described in greater details with reference to FIGS. 2(*a*) to 2(*c*).

Figure 2:
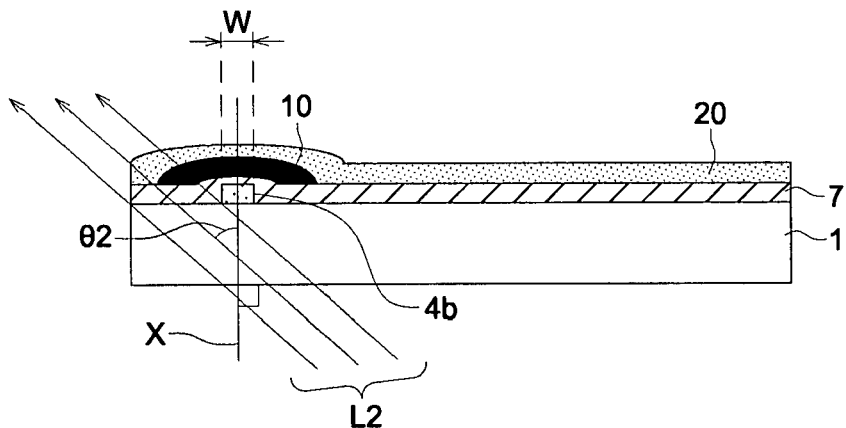
FIGS. 2(a) to 2(c) are explanatory diagrams showing an irradiation process in the Example 2.
Figure 2:
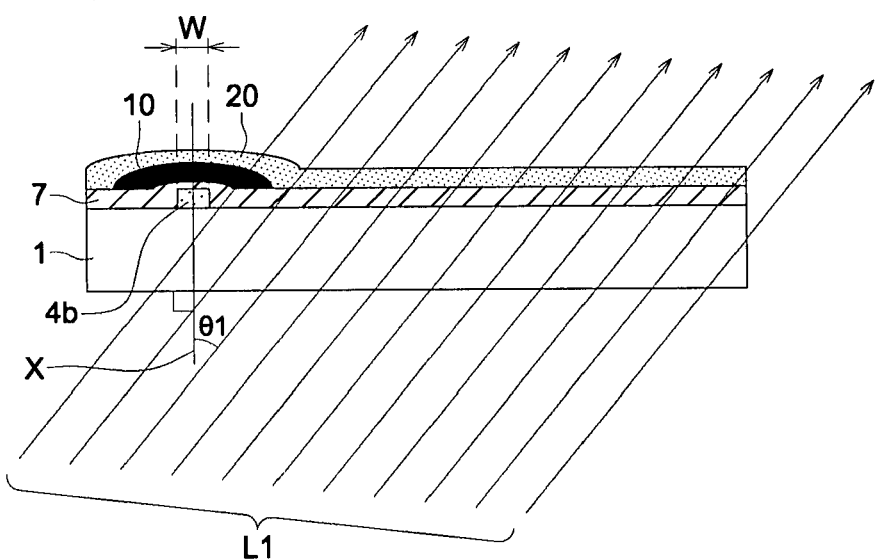
Figure 2:
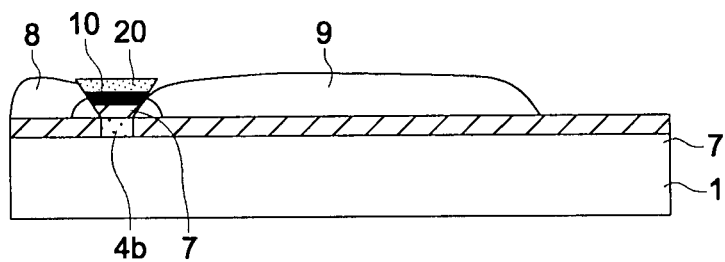

FIGS. 2(*a*) to 2(*c*) are explanatory diagrams showing an irradiation process in the Example 2. The same constituent elements as those of FIGS. 1(1-*a*) to 1(9-*b*) will be assigned with the same reference numerals, and the same description will be omitted to avoid duplication.

FIG. 2(*a*) is an explanatory diagram showing the first irradiation process. It gives the cross sectional view of the substrate 1 under the same conditions as those in FIG. 1(4-*b*). In the first irradiation process of FIG. 2(*a*), a light flux L2 of laser beam was applied at an angle θ2 included toward the side for forming a source electrode 8 with respect to the perpendicular line X of the substrate 1.

FIG. 2(*b*) is an explanatory diagram for illustrating the second irradiation process. It gives the cross sectional view of the substrate 1 under the same conditions as those in FIG. 1(4-*b*). In the second irradiation process of FIG. 2(*b*), a light flux L1 of laser beam was applied at an angle θ1 inclined toward the side for forming a drain electrode 9 with respect to the perpendicular line X of the substrate 1.

In this Example, the following setting was made:

|θ1|=|θ2|=45 degrees.

Then the Step S6 was carried out to form a source electrode and a drain electrode. The Steps S6 and thereafter are the same as those in the Example 1-1.

FIG. 2(*c*) shows that the source electrode 8 and the drain electrode 9 are formed in the Step S6.

The semiconductor layer 10 and the repellent layer 20 laminated on the gate electrode 4b exhibit a trapezoidal cross section after a laser beam was applied in the first and the second irradiation processes, as shown in FIG. 2(*c*). This arrangement increases the area of contact between the semiconductor layer 10 and the end face of the source electrode 8 and the drain electrode 9 formed in an inclined position by surface tension when the fluid electrode material 21 is dropped.

[Experimental Result]

Table 2 shows the experimental result. Of 100 organic TFT devices on the glass substrate produced under different conditions, 24 organic TFT devices were selected at random in this experiment, and the mobility and ON/OFF current ratio (the current value between the source and drain when the TFT is ON/the current value between the source and drain when the TFT is OFF) were evaluated for each of them.

TABLE 2

|  |  | Example 2 | Example 1-1 | Comp. 1 |
|---|---|---|---|---|
| Mobility ($cm^2/V \cdot S$) | Average value | 0.012 | 0.013 | 0.011 |
|  | Standard deviation | 0.000228 | 0.00663 | 0.010747 |
|  | Standard deviation/ average value | 0.019 | 0.051 | 0.977 |
| ON/OFF current ratio | Average value | 8.10E+03 | 3.20E+04 | 1.40E+04 |
|  | Standard deviation | 4872 | 14700 | 10733 |
|  | Standard deviation/ average value | 0.60 | 0.46 | 0.77 |

Comp.: Comparative example

The experimental result demonstrated that the mobility of the organic TFT produced in the Example 2 was equivalent to that in the Example 1-1, and variations were very small. It was also verified that the ON/OFF current ration was sufficient to meet practical performance requirements.

Example 3

In this Example, the substrate 1 was the same as that of the Example 1-1, and the conditions for the Steps S1 and S2 were the same as those in the Example 1-1. The Step S2B of forming an orientation layer 22 was arranged after the Step S2 of forming a gate insulation layer 7. The steps S3 and thereafter are the same as those in the Example 1-1.

Figure 3:
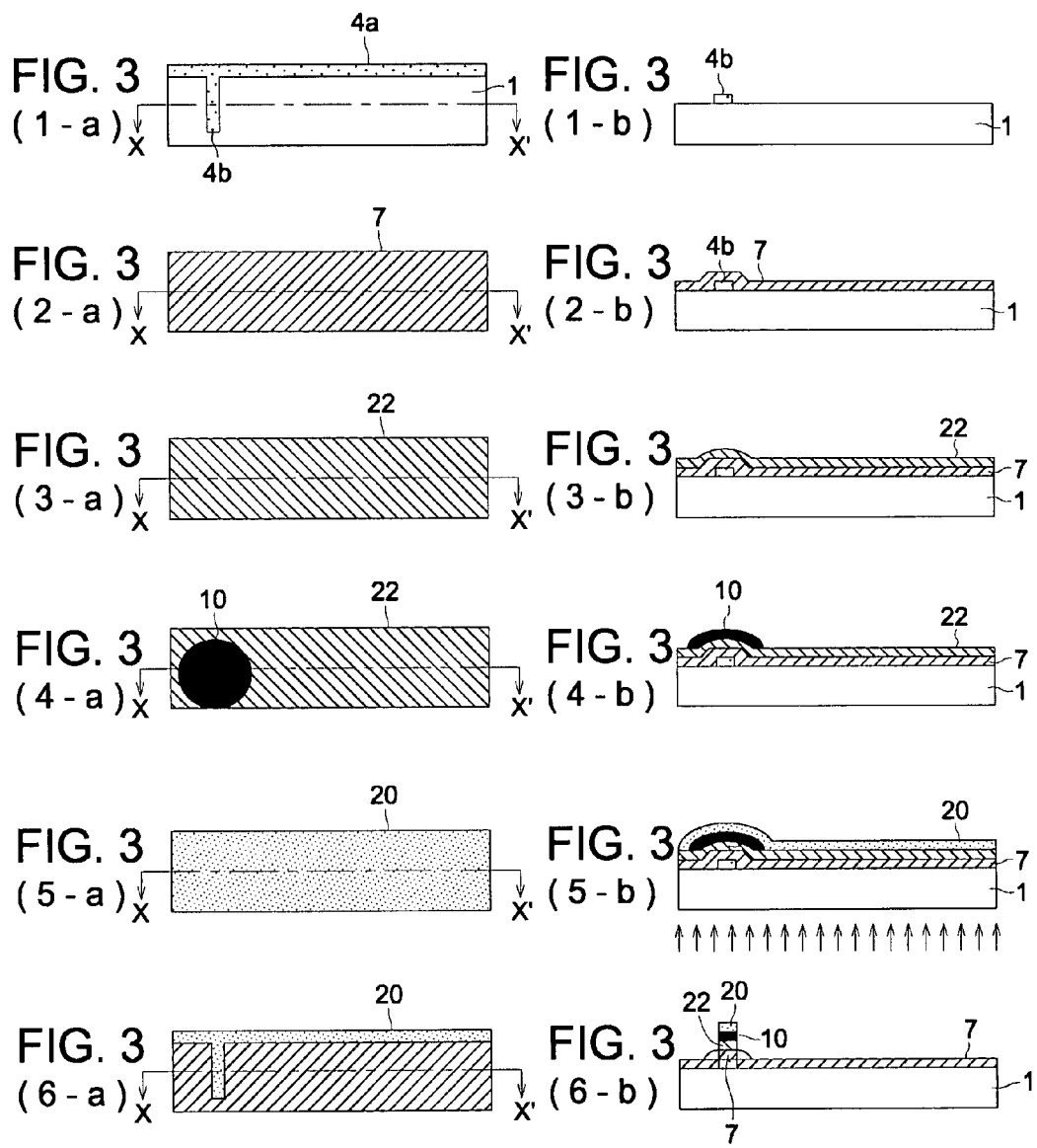
FIGS. 3(1-a) to 3(6-b) are explanatory diagrams showing the method of manufacturing the TFT in the Example 3.

FIGS. 3(1-a) to 3(6-b) are explanatory diagrams showing the method of manufacturing the TFT in the Example 3. Referring to FIGS. 3(1-a) to 3(6-b), the following describes the Example 3:

FIGS. 3(1-a) and 3(1-b) show the Step S1, and FIGS. 3(2-a) and 3(2-b) illustrate the Step S2. Steps S1 and S2 are the same as those in the Example 1-1, and will not be described. The following describes the step of forming the orientation layer 22.

S2B: A Step of Forming the Orientation Layer 22

In the step of forming the orientation layer 22, the substrate 1 processed in the Step S2 was immersed in the solvent obtained by dissolving 0.1 mol/l octadesyl trichlorosilane in toluene. Then the orientation layer 22 was formed on the surface of the gate insulation layer 7 subsequent to the Step S2, as shown in FIGS. 3(3-a) and 3(3-b).

As described above, when the gate insulation layer 7 is covered by octadesyl trichlorosilane as a self-assembled monolayer, the order of orientation of the semiconductor layer 10 is improved and the TFT switching performances are also upgraded. This improvement is disclosed in the Japanese Laid-Open Patent Publication No. 2005-79560, for example. The object of this process is to improve the orientation performance of the semiconductor layer 10 by forming the orientation layer 22.

FIGS. 3(4-a) and 3(4-b) show that a semiconductor layer 10 is formed on the orientation layer 22 in the Step S3.

FIGS. 3(5-a) and 3(5-b) show that the repellent layer 20 is formed on the orientation layer 22 in the Step S4. In the Step S4, the semiconductor layer 10 is coated with an aqueous solution of PVA at a thickness of 10 nm by the spin coating method. Then the substrate is subjected to the OTS treatment wherein it is immersed in the solvent obtained by dissolving 0.1 mol/l of the same octadesyl trichlorosilane as that of the Step S2B in toluene. Octadesyl trichlorosilane layers are formed on the upper and lower surfaces of the semiconductor layer 10.

The octadesyl trichlorosilane layer formed on the upper portion of the semiconductor layer 10 serves as a repellent layer 20 that utilizes water-repellency of octadesyl trichlorosilane. The octadesyl trichlorosilane layer formed on the lower portion of the semiconductor layer 10 serves as an orientation layer 22.

When the semiconductor layer and the repellent layer are removed in the Step S5, the gate insulation layer 7, orientation layer 22, the semiconductor layer 10 and the repellent layer 20 are laminated in that order on the gate electrode 4b, as shown in FIGS. 3(6-a) and 3(6-b).

The Steps S6 and thereafter are the same as those in the Example 1-1, and will not be described.

[Experimental Result]

Table 3 shows the experimental result. Of 100 organic TFT devices on the glass substrate produced under different conditions, 24 organic TFT devices were selected at random in this experiment, and the mobility and ON/OFF current ratio (the current value between the source and drain when the TFT is ON/the current value between the source and drain when the TFT is OFF) were evaluated for each of them.

TABLE 3

|  |  | Example 3 | Example 1-1 | Comp. 1 |
| --- | --- | --- | --- | --- |
| Mobility ($cm^2/V \cdot S$) | Average value | 0.021 | 0.013 | 0.011 |
|  | Standard deviation | 0.003003 | 0.000663 | 0.010747 |
|  | Standard deviation/average value | 0.143 | 0.051 | 0.977 |
| ON/OFF current ratio | Average value | 6.99E+04 | 3.20E+04 | 1.40E+04 |
|  | Standard deviation | 14341 | 14700 | 10733 |
|  | Standard deviation/average value | 0.21 | 0.46 | 0.77 |

Comp.: Comparative example

It has been revealed by the experimental result that both the mobility and ON/OFF current ratio of the organic TFT created in the Example 3 are much more improved and variations are smaller then in the Example 1-1. In the Example of the preset invention, it has been verified that the performances of the semiconductor device are improved by providing an orientation film 22 made of the same octadesyl trichlorosilane as the material forming the repellent layer 20.

Example 4

In this Example, the substrate 1 was the same as that the Example 1-1, and the same the Steps S1 and S2 were the same as those in the Example 1-1. The vacuum vapor deposition method was used in the Step S3 to form a semiconductor layer 10.

S3: A Step of Forming a Semiconductor Layer 10.

After cleaning, pentacene molecules were formed at a substrate temperature ranging from the room temperature to 100° C. by the vacuum vapor deposition method, and were processed into the shape of an island by the mask vapor deposition method or the photography method where oxygen was used as an etching gas, whereby an organic semiconductor film was formed. The film making speed at the time of vapor deposition was 3 nm/min. under a pressure of $5 \times 10^4$ Pa.

The Steps S4 and thereafter are the same as those in the Example 1-1, and will not be described.

In the Comparative Example 2, an organic TFT device was produced under the same conditions as those in the Comparative Example 1 except that the semiconductor material was replaced by the pentacene which was a low-molecular organic semiconductor material.

[Experimental Result]

Table 4 shows the experimental result. Of 100 organic TFT devices on the glass substrate produced under different conditions, 24 organic TFT devices were selected at random in this experiment, and the mobility and ON/OFF current ratio (the current value between the source and drain when the TFT is ON/the current value between the source and drain when the TFT is OFF) were evaluated for each of them.

TABLE 4

|  |  | Example 4 | Comp. 2 |
|---|---|---|---|
| Mobility ($cm^2/V \cdot S$) | Average value | 0.08 | 0.07 |
|  | Standard deviation | 0.00888 | 0.0994 |
|  | Standard deviation/average value | 0.111 | 1.42 |
| ON/OFF current ratio | Average value | 1.44E+05 | 1.30E+05 |
|  | Standard deviation | 48371 | 128371 |
|  | Standard deviation/average value | 0.34 | 0.99 |

Comp.: Comparative example

It was revealed by the experimental result that both the mobility and ON/OFF current ratio of the organic TFT created in the Example 4 were superior to those in the Comparative Example 2. It was also made clear that variations in mobility and ON/OFF current ratio were smaller. To be more specific, this experiment result demonstrated the excellent advantages of the embodiment of the present invention in the soluble high-molecular semiconductor material as well as in the molecular material.

Example 5

The following describes the Example 5 for the purpose of verifying the advantages of the embodiment of the present invention:

In this Example, the substrate 1 was the same as that of the Example 4, and the conditions for the Steps S1 through S3 were the same as those in the Example 4.

In the Step S4 of forming the repellent layer 20, the repellent layer 20 greater than the desired one was formed on the semiconductor layer 10 by the inkjet method.

In the Step S5, using the same commercially available excimer laser processing apparatus as that in the Example 2, a laser beam was applied from the rear surface of the substrate in two separate processes; a first and second irradiation processes. In the Example 4, the angle of the laser beam applied was changed in the opposite direction to that in the Example 2.

Figure 4:
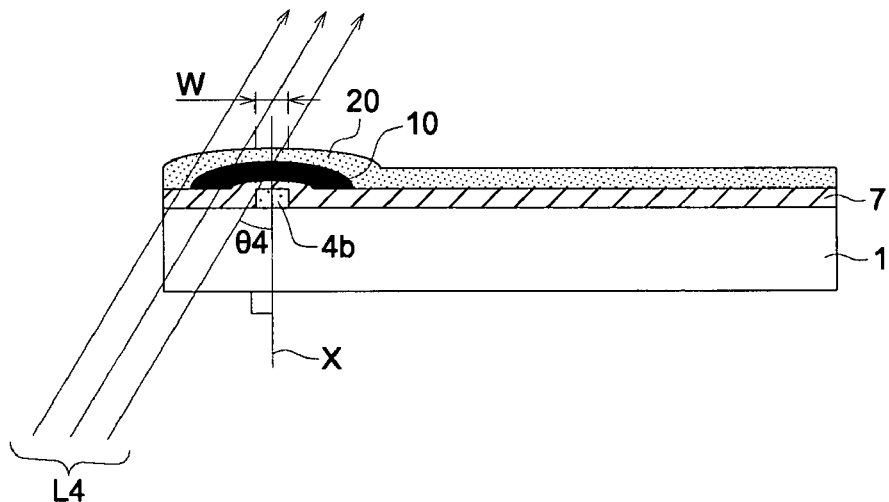
FIGS. 4(a) to 4(c) are explanatory diagrams showing an irradiation process in the Example 5.
Figure 4:
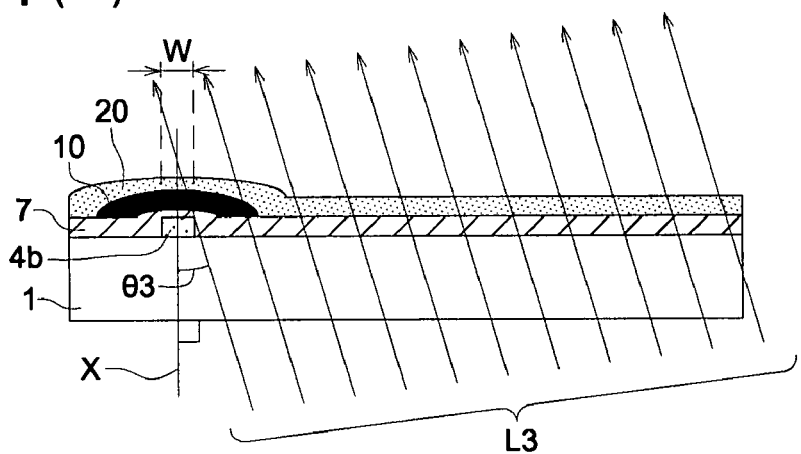
Figure 4:
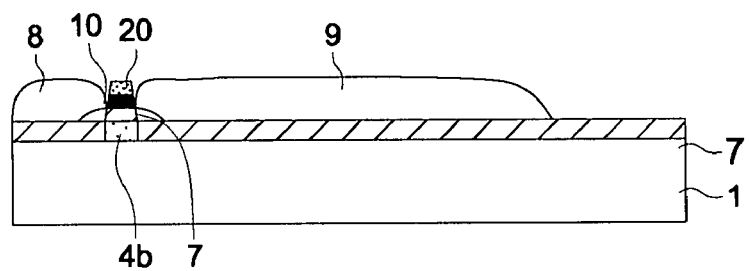

The following describes the details more specifically with reference to FIGS. 4(a) to 4(c).

FIGS. 4(a) to 4(c) are explanatory diagrams showing an irradiation process in the Example 5. The same constituent elements as those of FIG. 2 will be assigned with the same reference numerals, and the same description will be omitted to avoid duplication.

FIG. 4(a) is an explanatory diagram showing the first irradiation process. It gives the cross sectional view of the substrate 1 under the same conditions as those in FIG. 1(4-b). In the first irradiation process of FIG. 4(a), a light flux L4 of laser beam was applied at an angle θ4 inclined toward the side for forming a drain electrode 9 with respect to the perpendicular line X of the substrate 1.

FIG. 2(b) is an explanatory diagram showing the second irradiation process. It gives the cross sectional view of the substrate 1 under the same conditions as those in FIG. 1(4-b). In the second irradiation process of FIG. 2(b), a light flux L3 of laser beam was applied at an angle θ3 inclined toward the side for forming a source electrode 8 with respect to the perpendicular line X of the substrate 1.

In this Example, the following setting was made:
|θ1|=θ2|=75 degrees.

The Step S6 was carried out to form a source electrode and a drain electrode. The Steps S6 and thereafter are the same as those in the Example 1-1.

FIG. 4(c) shows that the source electrode 8 and the drain electrode 9 are formed in the Step S6.

After a laser beam was applied in the first and second irradiation processes, the semiconductor layer 10 and the repellent layer 20 laminated on the gate electrode 4b exhibit a trapezoidal cross section wherein the upper side is smaller, as shown in FIG. 4(c). In this manner, the semiconductor layer 10 can be made narrower than that gate electrode 4b by tilting the angle of irradiation. This arrangement is best suited to reducing the length of the channel for a larger current.

[Experimental Result]

Table 5 shows the experimental result. Of 100 organic TFT devices on the glass substrate produced under different conditions, 24 organic TFT devices were selected at random in this experiment, and the mobility and ON/OFF current ratio (the current value between the source and drain when the TFT is ON/the current value between the source and drain when the TFT is OFF) were evaluated for each of them.

TABLE 5

|  |  | Example 5 | Example 4 | Comp. 2 |
|---|---|---|---|---|
| Mobility ($cm^2/V \cdot S$) | Average value | 0.087 | 0.08 | 0.07 |
|  | Standard deviation | 0.0094 | 0.00888 | 0.0994 |
|  | Standard deviation/ average value | 0.11 | 0.111 | 1.42 |
| ON/OFF current ratio | Average value | 1.48E+05 | 1.44E+05 | 1.30E+05 |
|  | Standard deviation | 51259 | 48371 | 128371 |
|  | Standard deviation/ average value | 0.35 | 0.34 | 0.99 |

Comp.: Comparative example

The experimental result demonstrated that the mobility of the organic TFT produced in the Example 5 was about 9% greater than that in the Example 4. The effect of reducing the length of the channel was verified. Further, it was also revealed by the experiment result that both the mobility and ON/OFF current ratio of the organic TFT created in the Example 5 were superior to those in the Comparative Example 2, and variations in mobility and ON/OFF current ratio were smaller.

Example 6

In this Example, the substrate 1 was the same as that of the Example 4, and the conditions for the Steps S1 through S4 were the same as those in the Example 4.

Figure 5:
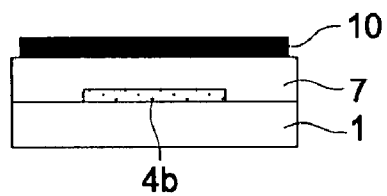
FIGS. 5(a) to 5(e) are explanatory diagrams showing the method of manufacturing the TFT in the Example 6.
Figure 5:
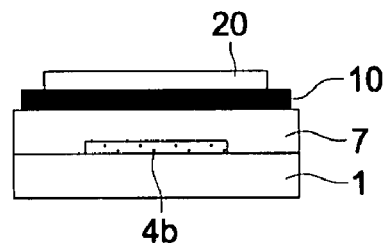
Figure 5:
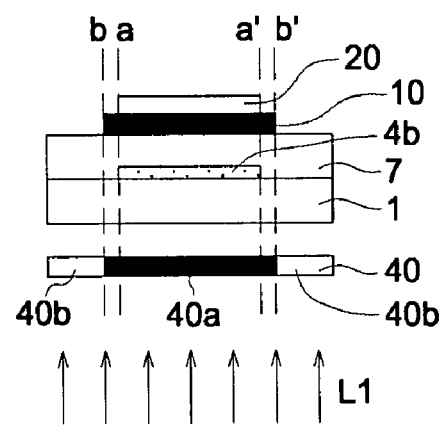
Figure 5:
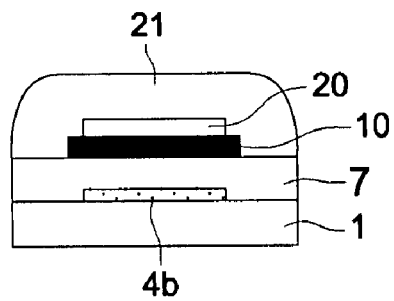
Figure 5:
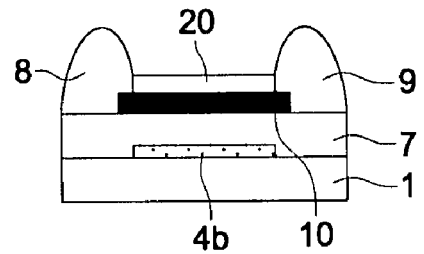

The following describes the Steps S3 and thereafter with reference to FIGS. 5(a) to 5(e). FIGS. 5(a) to 5(e) are explanatory diagrams showing the method of manufacturing the TFT in the Example 6;

FIG. 5(a) shows that the semiconductor layer 10 is formed in the Step S3.

FIG. 5(b) shows that a repellent layer 20 greater than the desired one was formed on the semiconductor layer 10 by the inkjet method in the Step S4.

FIG. 5(c) indicates that a laser beam L1 is applied from the rear surface of the substrate 1 through a photomask 40 in the Step S5. The laser beam used the second harmonics of the YAG laser and a galvano-mirror was employed for scanning.

The photomask 40 is made up of a mask (pattern) section 40a of a predetermined pattern configuration and a transparent portion 40b. The mask section 40a is not a perfect light shield section. The one used in the present Example allows passage of 25% light. In the meantime, the transparent portion 40b of the photomask 40 allows passage of almost 100% light.

The percentage in the amount of light passing through the mask section 40a is not restricted to 25%. The material of the repellent layer 20 can be removed by a smaller amount of light than that of the semiconductor layer 10. This property is utilized to set the amount of light to the level that can remove the repellent layer 20, but not the semiconductor layer 10. For example, when the laser beam L1 is applied to the area equivalent to the mask section 40a without using the photomask 41, the amount of the laser beam L1 can be set to the level capable of removing the repellent layer 20, but not the semiconductor layer 10.

The portion between the dotted line a and dotted line a' in FIG. 5(c) is completely protected by the gate electrode 4b against the laser beam L1 having passed through the mask section 40a. Further, the portion between the dotted line a and dotted line b and that between the dotted line a' and dotted line b' is not protected by the gate electrode 4b against the laser beam L1 having passed the mask section 40a, and therefore, 25% laser beam is applied to this area. As shown in FIG. 5(c), the portion on the semiconductor layer 10 exposed to the laser beam having passed through the mask section 40a remains unremoved, while the repellent layer 20 formed on the semiconductor layer 10 is removed. Further, the portions of both the semiconductor layer 10 and the repellent layer 20 exposed to the laser beam having passed through the transparent portion 40b are removed.

If light is applied by the two-stage mask of the photomask 40 and gate electrode 4b, the semiconductor layer 10 can be formed to have a desired configuration, and the repellent layer 20 on the semiconductor layer 10 can be formed to, have a desired configuration smaller than the semiconductor layer 10, in a single operation of exposure, as shown in FIG. 5(c).

FIG. 5(d) shows that the fluid electrode material 21 is dropped in the Step S6. In this Example, similarly to the case of the Example 4, an adequate amount of PEDOT/PSS (poly (ethylenedioxythiophene)/poly(styrenesulfonic acid)) is dropped as the fluid electrode material 21 on the substrate 1 according to the inkjet method.

FIG. 5(e) shows that the fluid electrode material 21 is separated to be the source electrode 8 and the drain electrode 9 under the interaction from the surface of the repellent layer 20. The area of the repellent layer 20 is smaller than that of the semiconductor layer 10, and this arrangement increases the contact area between the semiconductor layer 10 and each of the source electrode 8 and the drain electrode 9.

[Experimental Result]

Table 6 shows the experimental result. Of 100 organic TFT devices on the glass substrate produced under different conditions, 24 organic TFT devices were selected at random in this experiment, and the mobility and ON/OFF current ratio (the current value between the source and drain when the TFT is ON/the current value between the source and drain when the TFT is OFF) were evaluated for each of them.

TABLE 6

| | | Example 6 | Example 4 | Comp. 2 |
|---|---|---|---|---|
| Mobility ($cm^2/V \cdot S$) | Average value | 0.097 | 0.08 | 0.07 |
| | Standard deviation | 0.0012 | 0.00888 | 0.0994 |
| | Standard deviation/ average value | 0.12 | 0.111 | 1.42 |
| ON/OFF current ratio | Average value | 9.40E+04 | 1.44E+05 | 1.30E+05 |
| | Standard deviation | 35989 | 48371 | 128371 |
| | Standard deviation/ average value | 0.38 | 0.34 | 0.99 |

Comp.: Comparative example

The experimental result demonstrated that the mobility of the organic TFT produced in the Example 6 was about 20% greater than that in the Example 4. This has verified the effect of increasing the contact area between the semiconductor layer 10 and each of the source electrode 8 and the drain electrode 9. Further, it was also revealed by the experimental result that both the mobility and ON/OFF current ratio of the organic TFT created in the Example 6 were superior to those in the Comparative Example 2, and variations in mobility and ON/OFF current ratio were smaller.

Example 7

In this Example, the substrate 1 was the same as that of the Example 4, and the conditions for the Steps S1 and S2 were the same as those in the Example 4.

The following describes the Steps S3 and thereafter with reference to FIGS. 6(a)-6(e). FIGS. 6(a)-6(e) are explanatory diagrams showing the method of manufacturing the TFT in the Example 7.

Figure 6:
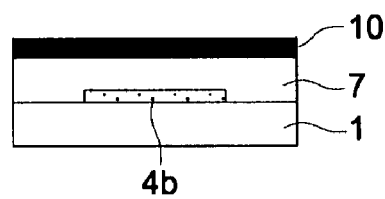
FIGS. 6(a) to 6(e) are explanatory diagrams showing the method of manufacturing the TFT in the Example 7.
Figure 6:
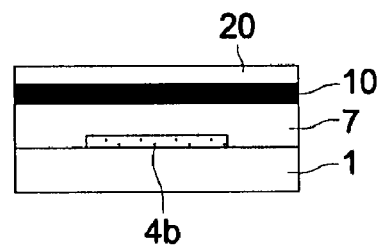
Figure 6:
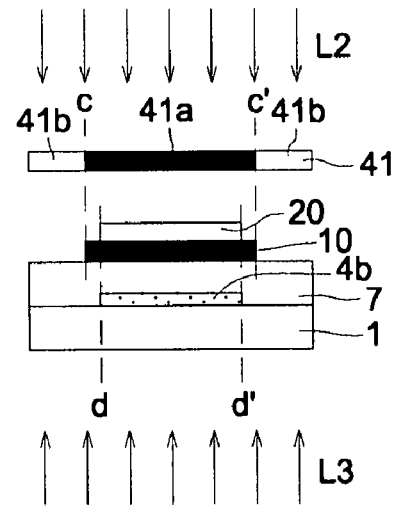
Figure 6:
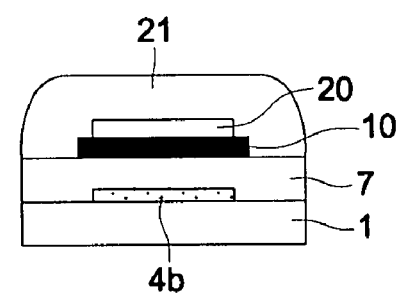
Figure 6:
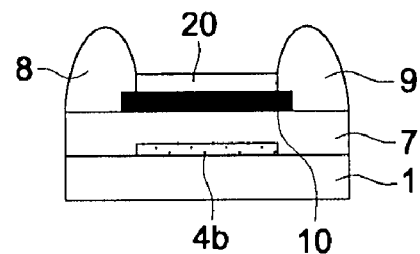

FIG. 6(a) indicates that the semiconductor layer 10 is formed over the entire surface of the substrate 1 in the Step S3. The semiconductor material is pentacene, and the semiconductor layer 10 is formed over the entire surface of the substrate 1 by the vacuum vapor deposition.

FIG. 6(b) indicates that the repellent layer 20 is formed on the semiconductor layer 10 in the Step S4. In the Step S4, similarly to the case of the Example 4, the aqueous solution of PVA was coated on the semiconductor layer 10 by the spin coating method at a thickness of 10 nm. After that, the substrate 1 processed in the Step S3 was immersed in the solution prepared by dissolving 0.1 mol/l of octadesyl trichlorosilane as self-assembled monolayer in toluene.

FIG. 6(c) shows that laser beam L3 was applied from the rear surface of the substrate 1, and simultaneously, laser beam L2 is applied from the front surface of the substrate 1 through the photomask 41 in the Step S5. Both the laser beam L2 and laser beam L3 used the second harmonics of the YAG laser, and a galvano-mirror was employed for scanning.

The photomask 41 is made up of a light shield section 41a of a predetermined pattern configuration and a transparent section 41b. The light shield section 41a blocks light completely, and the transparent section 41b allows passage of almost 100% light.

The amount of the laser beam L3 is set to the level wherein the repellent layer 20, but not the semiconductor layer 10, can be removed. Further, the amount of laser beam L2 having passed through the transparent section 41b can remove both the semiconductor layer 10 and the repellent layer 20.

The same result can be obtained by ensuring that the scanning of the laser beam L2 is stopped so as not to scan the portion corresponding to the light shield section 41a, instead of using the photomask 41.

The portion between the dotted line c and dotted line c' in FIG. 6(c) is protected against laser beam L2 by the light shield section 41a. The laser beam L2 is not applied to this portion, but the laser beam L2 having passed through the transparent section 41b is applied to other portion. Thus, the semiconductor layer 10 are repellent layer 20 are removed as shown in FIG. 6(c).

The portion between the dotted line d and dotted line d' is protected against light by the gate electrode 4b. The repellent layer 20 is removed from the area exposed to the laser beam L3 except for the portion between the dotted line d ad dotted line d', as shown in FIG. 6(c).

The portion between the dotted line c and dotted line d and that between the dotted line c' and dotted line d' are protected by the light shield section 41a against the laser beam L2, and the laser beam L3 is applied to the repellent layer 20 from the rear surface of the substrate 1. Thus, in these areas, the semiconductor layer 10 remain unremoved, while the repellent layer 20 on the semiconductor layer 10 is removed.

As described above, the amount of laser beam L3 capable of removing only the repellent layer 20 is applied from the rear of the surface of the substrate 1 wherein the gate electrode 4b is formed. Thus, the repellent layer 20 of a desired configuration smaller than the semiconductor layer 10 can be formed on the semiconductor layer 10, as shown in FIG. 6(c).

FIG. 6(d) indicates that the fluid electrode material 21 is dropped in the Step S6, and FIG. 6(e) shows that the fluid electrode material 21 is separated to be the source electrode 8 and the drain electrode 9 under the interaction from the surface of the repellent layer 20. The following steps are the same as those in the Example 6, and will not be described.

[Experimental Result]

Table 7 shows the test result. Of 100 organic TFT devices on the glass substrate produced under different conditions, 24 organic TFT devices were selected at random in this experiment, and the mobility and ON/OFF current ratio (the current value between the source and drain when the TFT is ON/the current value between the source and drain when the TFT is OFF) were evaluated for each of them.

TABLE 7

|  |  | Example 7 | Example 4 | Comp. 2 |
|---|---|---|---|---|
| Mobility ($cm^2/V \cdot S$) | Average value | 0.11 | 0.08 | 0.07 |
|  | Standard deviation | 0.014 | 0.00888 | 0.0994 |
|  | Standard deviation/average value | 0.13 | 0.111 | 1.42 |
| ON/OFF current ratio | Average value | 2.56E+04 | 1.44E+05 | 1.30E+05 |
|  | Standard deviation | 10987 | 48371 | 128371 |
|  | Standard deviation/average value | 0.43 | 0.34 | 0.99 |

Comp.: Comparative example

The experimental result demonstrated that the mobility of the organic TFT produced in the Example 7 was about 38% greater than that in the Example 4. This has verified the effect of increasing the contact area between the semiconductor layer 10 and each of the source electrode 8 and the drain electrode 9. Further, it was also revealed by the experimental result that both the mobility and ON/OFF current ratio of the organic TFT created in the Example 7 were superior to those in the Comparative Example 2, and variations in mobility and ON/OFF current ratio were smaller.

Example 8

In this Example, the substrate 1 was the same as that of the Example 4, and the conditions for the Steps S1 and S2 were the same as those in the Example 4.

Figure 7:
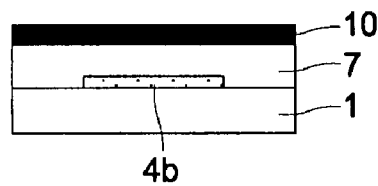
FIGS. 7(a) to 7(e) are explanatory diagrams showing the method of manufacturing the TFT in the Example 8.
Figure 7:
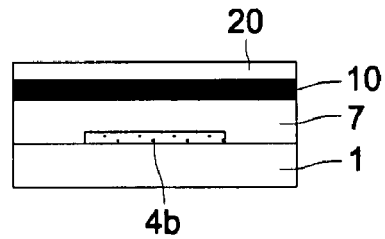
Figure 7:
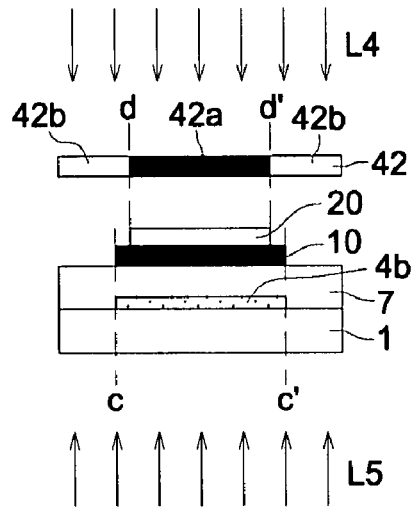
Figure 7:
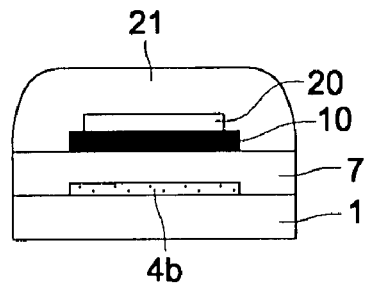
Figure 7:
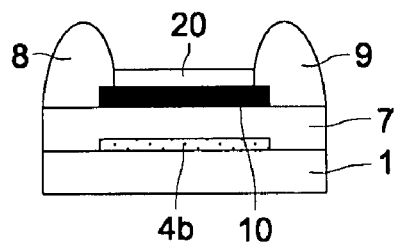

The following describes the Steps S3 and thereafter with reference to FIGS. 7(a)-7(e). FIGS. 77(a)-7(e) are explanatory diagrams showing the method of manufacturing the TFT in the Example 8.

FIG. 7(a) shows that the semiconductor layer 10 is formed over the entire surface of the substrate 1 in the Step S3. The semiconductor material is pentacene. The semiconductor layer 10 is formed over the entire surface of the substrate 1 by the vacuum vapor deposition.

FIG. 7(b) indicates that the repellent layer 20 is formed on the semiconductor layer 10 in the Step S4. In the Step S4, similarly to the case of the Example 4, the semiconductor layer 10 was coated with the aqueous solution of PVA at a thickness of 10 nm by the spin coating method. After that, the substrate 1 processed in the Step S3 was immersed in the solvent prepared by dissolving 0.1 mol/l of octadesyl trichlorosilane as a self-assembled monolayer in toluene.

FIG. 7(c) shows that laser beam L5 was applied from the rear surface of the substrate 1, and simultaneously, laser beam L4 is applied from the front surface of the substrate 1 through the photomask 42 in the Step S5. Both the laser beam L4 and laser beam L5 used the second harmonics of the YAG laser and a galvano-mirror was employed for scanning.

The photomask 42 is made up of a light shield section 42a of a predetermined pattern configuration and a transparent section 42b. The light shield section 42a blocks light completely, and the transparent section 42b allows passage of 25% light.

The transmittance of the transparent section 42b is not restricted to 25%. The material of the repellent layer 20 can be removed by a smaller amount of light than that of the semiconductor layer 10. This property is utilized to set the amount of light to the level that can remove the repellent layer 20, but not the semiconductor layer 10. For example, it is also possible to make such arrangements that the amount of the laser beam L4 is set to the level capable of removing the repellent layer 20, but not the semiconductor layer 10, and the laser beam L2 is applied only to the portion wherein the repellent layer 20 is removed, without using the photomask 42, The portion between the dotted line c and dotted line c' in FIG. 7(c) is protected against light by the gate electrode 4b. The semiconductor layer 10 and the repellent layer 20 are removed from the area exposed to the laser beam L5 except for the portion between the dotted line c and dotted line c', as shown in FIG. 7(c).

The portion between the dotted line d and dotted line d' is protected by the light shield section 42a against the laser beam L4, and therefore, the laser beam L3 is not applied to this portion. Other portions are exposed to the laser beam L2 having passed through the transparent section 42b.

The portion between the dotted line c and dotted line d and that between the dotted line c' and dotted line d' are protected by the gate electrode 4b against the laser beam L5, and the laser beam L4 having passed through the transparent section 42b is applied to the repellent layer 20. The semiconductor layer 10 in this portion remains unremoved, and the repellent layer 20 formed on the semiconductor layer 10 is removed.

As described above, when the amount of laser beam L4 capable of removing only the repellent layer 20 is applied from the direction of the repellent layer 20 formed on the substrate 1, it is possible to form the repellent layer 20 on the semiconductor layer 10 to have a desired configuration smaller than the semiconductor layer 10, as shown in FIG. 7(c).

FIG. 7(d) indicates that the fluid electrode material 21 is dropped in the Step S6. FIG. 7(e) shows that fluid electrode material 21 is separated to be the source electrode 8 and the drain electrode 9 under the interaction of the surface of the repellent layer 20. The steps thereafter are the same as those in the Example 6, and will not be described to avoid duplication.

[Experimental Result]

Table 8 shows the experimental result. Of 100 organic TFT devices on the glass substrate produced under different conditions, 24 organic TFT devices were selected at random in this experiment, and the mobility and ON/OFF current ratio (the current value between the source and drain when the TFT is ON/the current value between the source and drain when the TFT is OFF) were evaluated for each of them.

TABLE 8

| | | Example 8 | Example 4 | Comp. 2 |
|---|---|---|---|---|
| Mobility ($cm^2/V \cdot S$) | Average value | 0.1 | 0.08 | 0.07 |
| | Standard deviation | 0.017 | 0.00888 | 0.0994 |
| | Standard deviation/average value | 0.17 | 0.111 | 1.42 |
| ON/OFF current ratio | Average value | 8.71E+04 | 1.44E+05 | 1.30E+05 |
| | Standard deviation | 45799 | 48371 | 128371 |
| | Standard deviation/average value | 0.53 | 0.34 | 0.99 |

Comp.: Comparative example

The experimental result demonstrated that the mobility of the organic TFT produced in the Example 8 was about 25% greater than that in the Example 4. This has verified the effect of increasing the contact area between the semiconductor layer 10 and each of the source electrode 8 and the drain electrode 9. Further, it was also revealed by the experimental result that both the mobility and ON/OFF current ratio of the organic TFT created in the Example 8 were superior to those in the Comparative Example 2, and variations in mobility and ON/OFF current ratio were smaller.

As described above, the embodiment of the present invention provides a method of manufacturing a low-cost thin film transistor of minimized variations in performances, as well as the thin film transistor produced thereby.

The method of manufacturing a thin film transistor according to the embodiment of the present invention is not restricted to the application to the formation of a channel formation area made of the organic semiconductor thin film in the organic thin film transistor as described with reference to the Examples. To be more specific, the method of manufacturing the thin film transistor according to the embodiment of the present invention can be applied to the following:

(1) A method of forming a gate electrode made up of an organic thin film by applying (preferably, only by applying) energy rays to the organic thin film constituting the organic thin film integrated circuit (specifically, gate electrode), whereby the portion of the organic thin film exposed to energy rays is removed;

(2) A method of forming a source/drain electrode made of an organic thin film by applying (preferably, only by applying) energy rays to the organic thin film constituting an organic thin film integrated circuit (specifically, source/drain electrode), whereby the portion of the organic thin film exposed to energy rays is removed;

(3) A method of forming an electrical wire made up of an organic thin film by applying (preferably, only by applying) energy rays to the organic thin film constituting an organic thin film integrated circuit (specifically, various electrical wires), whereby the portion of the organic thin film exposed to energy rays is removed;

(4) A method of forming a patterned insulation layer made up of an organic thin film by applying (preferably, only by applying) energy rays to the organic thin film constituting an organic thin film integrated circuit (specifically, insulation film, interlayer insulation layer, passivation film and other various types of insulation layers), whereby the portion of the organic thin film exposed to energy rays is removed; and (5) A method wherein the opening for providing a connection hole such as a contact hole and via hole, and the opening for providing a connection with a connector are arranged on an insulation layer made of an organic thin film, by applying (preferably, only by applying) energy rays to the organic thin film constituting an organic thin film integrated circuit (specifically, insulation film, interlayer insulation layer, passivation film and other various types of insulation layers) so that the portion of the organic thin film exposed to energy rays is removed.

In the aforementioned (1) through (5), the material best suited to the organic thin film integrated circuit constituent element should be selected as an organic thin film constituting the gate electrode, source/drain electrode, various types of electrical wires, insulation film, interlayer insulation layer, passivation film and various other insulation layers (collectively referred to as an organic thin film integrated circuit constituent element). The energy ray best suited to the material of the organic thin film integrated circuit constituent element without damaging the substrate should be selected as the energy ray to be applied to such an organic thin film. Similarly, the method and conditions for applying energy rays, and the mode for removing the organic thin film should be adequately selected, set and determined in conformity to the organic thin film integrated circuit constituent element, or the organic thin film constituting the organic thin film integrated circuit constituent element.

In the embodiment of the present invention, patterning by exposure can be provided after the semiconductor and the electrode material of the source electrode and the drain electrode has been coated over the entire surface. Alternatively, patterning by exposure can be provided after rough patterning by inkjet or otherwise. The latter arrangement requires shorter production time. It is also possible to coat one of them over the entire surface and to provide the other with rough shattering.

What is claimed is:

1. A method of manufacturing a thin film transistor which includes at least a gate electrode, a semiconductor layer, a source electrode and a drain electrode on a transmissive substrate, the method comprising:
   forming the gate electrode on the substrate;
   forming a gate insulation layer on the gate electrode;
   forming the semiconductor layer on the gate insulation layer;
   forming a repellent layer on the semiconductor layer, the repellent layer being repellent to a fluid electrode material;

applying light to simultaneously remove both a part of the semiconductor layer and a part of the repellent layer other than an area shaded from the light by the gate electrode, by applying the light from an opposite surface of the substrate to a surface of the substrate on which the gate electrode is formed; and forming the source electrode and the drain electrode by dropping the fluid electrode material on the repellent layer and dividing the fluid electrode material by the repellent layer.

2. The method of manufacturing the thin film transistor of claim 1, wherein the semiconductor layer is formed by an inkjet method.

3. The method of manufacturing the thin film transistor of claim 1, wherein the repellent layer is formed by an inkjet method.

4. The method of manufacturing the thin film transistor of claim 1, wherein the repellent layer includes a self assembled monolayer.

5. The method of manufacturing the thin film transistor of claim 1, wherein the removing comprises removing a part of the repellent layer by applying second light also from the opposite surface of the substrate to a surface on which the repellent layer is formed, an amount of the second light being enough to remove the repellent layer and not enough to remove the semiconductor layer.

6. A method of manufacturing a thin film transistor which includes at least a gate electrode, a semiconductor layer, a source electrode and a drain electrode on a transmissive substrate, the method comprising:

forming the gate electrode on the substrate;
forming a gate insulation layer on the gate electrode;
forming the semiconductor layer on the gate insulation layer;
forming a repellent layer on the semiconductor layer, the repellent layer being repellent to a fluid electrode material;
applying light to simultaneously remove both a part of the semiconductor layer and a part of the repellent layer other than an area shaded from the light by the gate electrode, by applying the light from an opposite surface of the substrate to a surface of the substrate on which the gate electrode is formed, wherein the applying light comprises:
  irradiating a first light on a source electrode area of the substrate on which the source electrode is to be formed; and
  irradiating a second light on a drain electrode area of the substrate on which the drain electrode is to be formed, wherein the first light is irradiated at an angle at which a traveling direction of the first light is declined to the source electrode area with respect to a vertical direction to the substrate, and the second light is irradiated at an angle at which a traveling direction of the second light is declined to the drain electrode area with respect to a vertical direction to the substrate; and
forming the source electrode and the drain electrode by dropping the fluid electrode material on the repellent layer and dividing the fluid electrode material by the repellent layer.

7. A method of manufacturing a thin film transistor which includes at least a gate electrode, a semiconductor layer, a source electrode and a drain electrode on a transmissive substrate, the method comprising:

forming the gate electrode on the substrate;
forming a gate insulation layer on the gate electrode;
forming the semiconductor layer on the gate insulation layer;
forming a repellent layer on the semiconductor layer, the repellent layer being repellent to a fluid electrode material;
applying light to simultaneously remove both a part of the semiconductor layer and a part of the repellent layer other than an area shaded from the light by the gate electrode, by applying the light from an opposite surface of the substrate to a surface of substrate on which the gate electrode is formed, wherein the applying light comprises:
  irradiating a first light on a source electrode area of the substrate on which the source electrode is to be formed; and
  irradiating a second light on a drain electrode area of the substrate on which the drain electrode is to be formed, wherein the first light is irradiated at an angle at which a traveling direction of the first light is declined to the drain electrode area with respect to a vertical direction to the substrate, and the second light is irradiated at an angle at which a traveling direction of the light is declined to the source electrode area with respect to a vertical direction to the substrate; and
forming the source electrode and the drain electrode by dropping the fluid electrode material on the repellent layer and dividing the fluid electrode material by the repellent layer.

8. A method of manufacturing a thin film transistor which includes at least a gate electrode, a semiconductor layer, a source electrode and a drain electrode on a transmissive substrate, the method comprising:

forming the gate electrode on the substrate;
forming a gate insulation layer on the gate electrode;
forming the semiconductor layer on the gate insulation layer;
forming a repellent layer on the semiconductor layer, the repellent layer being repellent to a fluid electrode material;
applying light to simultaneously remove both a part of the semiconductor layer and a part of the repellent layer other than an area shaded from the light by the gate electrode, by applying the light from an opposite surface of the substrate to a surface of the substrate on which the gate electrode is formed, wherein the applying light comprises:
  irradiating a first light on a first side of the gate electrode, on which the source electrode or the drain electrode is formed; and
  irradiating a second light on a second side of the gate electrode, on which the source electrode or the drain electrode is formed, wherein the first light is irradiated at an angle at which a traveling direction of the first light is declined to the second side with respect to a vertical direction to the substrate, and the second light is irradiated at an angle at which a traveling direction of the second light is declined to the first side with respect to a vertical direction to the substrate; and
forming the source electrode and the drain electrode by dropping the fluid electrode material on the repellent layer and dividing the fluid electrode material by the repellent layer.

9. A method of manufacturing a thin film transistor which includes at least a gate electrode, a semiconductor layer, a source electrode and a drain electrode on a transmissive substrate, the method comprising:

forming the gate electrode on the substrate;

forming a gate insulation layer on the gate electrode;

forming the semiconductor layer on the gate insulation layer;

forming a repellent layer on the semiconductor layer, the repellent layer being repellent to a fluid electrode material;

applying light to simultaneously remove both a part of the semiconductor layer and a part of the repellent layer other than an area shaded from the light by the gate electrode, by applying the light from an opposite surface of the substrate to a surface of the substrate on which the gate electrode is formed, wherein the applying light comprises:

irradiating a first light on a first side of the gate electrode, on which the source electrode or the drain electrode is formed; and irradiating a second light on a second side of the gate electrode, on which the source electrode or the drain electrode is formed, wherein the first light is irradiated at an angle at which a traveling direction of the first light is declined to the first side with respect to a vertical direction to the substrate, and the second light is irradiated at an angle at which a traveling direction of the second light is declined to the second side with respect to a vertical direction to the substrate; and forming the source electrode and the drain electrode by dropping the fluid electrode material on the repellent layer and dividing the fluid electrode material by the repellent layer.

10. The method of manufacturing the thin film transistor of claim 1, comprising forming an alignment layer on the gate insulation layer before forming the semiconductor layer and after forming the gate insulation layer.

11. A method of manufacturing a thin film transistor which includes at least a gate electrode, a semiconductor layer, a source electrode and a drain electrode on a transmissive substrate, the method comprising:

forming the gate electrode on the substrate;

forming a gate insulation layer on the gate electrode;

forming the semiconductor layer on the gate insulation layer;

forming a repellent layer on the semiconductor layer, the repellent layer being repellent to a fluid electrode material;

removing a part of the repellent layer and a part of the semiconductor layer by irradiating the part of the repellent layer and the part of the semiconductor layer with light so that a residual repellent layer has the same shape as the gate electrode and a residual semiconductor layer has a shape larger than the shape of the residual repellent layer; and forming the source electrode and the drain electrode.

12. A method of manufacturing a thin film transistor which includes at least a gate electrode, a semiconductor layer, a source electrode and a drain electrode on a transmissive substrate, the method comprising:

forming the gate electrode on the substrate;

forming a gate insulation layer on the gate electrode;

forming the semiconductor layer on the gate insulation layer;

forming a repellent layer on the semiconductor layer, the repellent layer being repellent to a fluid electrode material;

irradiating the substrate, from an opposite surface of the substrate to a surface of the substrate where the gate electrode is formed, with light through both a photo mask, having a mask pattern portion that extends past the gate electrode, and a transparent portion to remove a art of the repellent layer irradiated with the light having passing through the mask pattern portion and the transparent portion and to remove a part of the semiconductor layer irradiated with the light having passing through the transparent portion so that both 1) a part of the repellent layer shaded from the light by the gate electrode and 2) a part of the semiconductor layer shaded from the light by the mask pattern portion that extends past the gate electrode are left, wherein the mask pattern portion transmits light whose amount of light is enough to remove the repellent layer and not enough to remove the semiconductor layer when light strong enough to remove the semiconductor layer enters the photo mask; and forming the source electrode and the drain electrode.

* * * * *